(12) United States Patent
Hwang et al.

(10) Patent No.: US 12,412,792 B2
(45) Date of Patent: Sep. 9, 2025

(54) COMPARTMENT SHIELDING WITH METAL FRAME AND CAP

(71) Applicant: STATS ChipPAC Pte. Ltd., Singapore (SG)

(72) Inventors: Bokyeong Hwang, Incheon (KR); Jingwan Kim, Incheon (KR); Minjung Kim, Incheon (KR)

(73) Assignee: STATS ChipPAC Pte. Ltd., Singapore (SG)

( * ) Notice: Subject to any disclaimer, the term of this patent is extended or adjusted under 35 U.S.C. 154(b) by 0 days.

(21) Appl. No.: 18/454,709

(22) Filed: Aug. 23, 2023

(65) Prior Publication Data

US 2023/0402332 A1 Dec. 14, 2023

Related U.S. Application Data

(63) Continuation of application No. 17/447,041, filed on Sep. 7, 2021, now Pat. No. 11,776,861.

(51) Int. Cl.
*H01L 23/051* (2006.01)
*H01L 21/60* (2006.01)
*H01L 23/049* (2006.01)
*H05K 9/00* (2006.01)

(52) U.S. Cl.
CPC ............ *H01L 23/051* (2013.01); *H01L 21/60* (2021.08); *H01L 23/049* (2013.01); *H05K 9/0024* (2013.01); *H05K 9/0032* (2013.01); *H05K 9/0033* (2013.01); *H01L 2021/60082* (2013.01)

(58) Field of Classification Search
CPC ... H05K 9/0032; H05K 9/0033; H05K 9/0024
See application file for complete search history.

(56) References Cited

U.S. PATENT DOCUMENTS

| 5,895,884 | A  | 4/1999 | Davidson |
| 9,070,793 | B2 | 6/2015 | Liao et al. |
| 9,924,616 | B2 | 3/2018 | Song et al. |
| 10,660,246 | B1 | 5/2020 | Huang et al. |

(Continued)

FOREIGN PATENT DOCUMENTS

| CN | 102176438 A | 9/2011 |
| CN | 109935523 A | 6/2019 |

(Continued)

OTHER PUBLICATIONS

Machine language translation of CN-110461138-A (Year: 2019).*

*Primary Examiner* — Erik Kielin
(74) *Attorney, Agent, or Firm* — Brian M. Kaufman; Robert D. Atkins; PATENT LAW GROUP: Atkins and Associates, P.C.

(57) ABSTRACT

A semiconductor device has a substrate and a first semiconductor die disposed over the substrate. A first metal frame is disposed over the substrate around the first semiconductor die. A first metal lid is disposed over the first metal frame. A flap of the first metal lid includes an elastic characteristic to latch onto the first metal frame. An edge of the flap can have a castellated edge. A recess in the first metal frame and a protrusion on the first metal lid can be used to latch the first metal lid onto the first metal frame. A second metal frame and second metal lid can be disposed over an opposite surface of the substrate from the first metal frame.

24 Claims, 8 Drawing Sheets

(56) References Cited

U.S. PATENT DOCUMENTS

| | | |
|---|---|---|
| 2007/0094977 A1 | 5/2007 | Zuehlsdorf et al. |
| 2009/0190321 A1* | 7/2009 | Yamazaki ............ H05K 9/0032 |
| | | 361/818 |
| 2009/0273912 A1 | 11/2009 | Myers et al. |
| 2011/0037169 A1* | 2/2011 | Pagaila ............... H01L 25/0657 |
| | | 257/E21.705 |
| 2012/0025356 A1 | 2/2012 | Liao et al. |
| 2013/0010435 A1 | 1/2013 | Ogatsu |
| 2015/0264842 A1 | 9/2015 | Song et al. |
| 2016/0044835 A1 | 2/2016 | Lee et al. |
| 2016/0066482 A1 | 3/2016 | Chi et al. |
| 2017/0181336 A1 | 6/2017 | Robinson et al. |
| 2018/0323170 A1 | 11/2018 | Kim et al. |
| 2019/0189565 A1 | 6/2019 | Chen |
| 2019/0252756 A1 | 8/2019 | Lee et al. |
| 2020/0093041 A1 | 3/2020 | Jung |

FOREIGN PATENT DOCUMENTS

| | | | | |
|---|---|---|---|---|
| CN | 110461138 A | * | 11/2019 | ........... H05K 9/0024 |
| CN | 110911390 A | | 3/2020 | |
| CN | 210136870 U | | 3/2020 | |
| KR | 20160164267 A | | 12/2016 | |
| KR | 20170006527 A | | 1/2017 | |
| KR | 20170110941 A | | 10/2017 | |
| KR | 20170111803 A | | 10/2017 | |
| TW | I351741 B | | 4/2009 | |

* cited by examiner

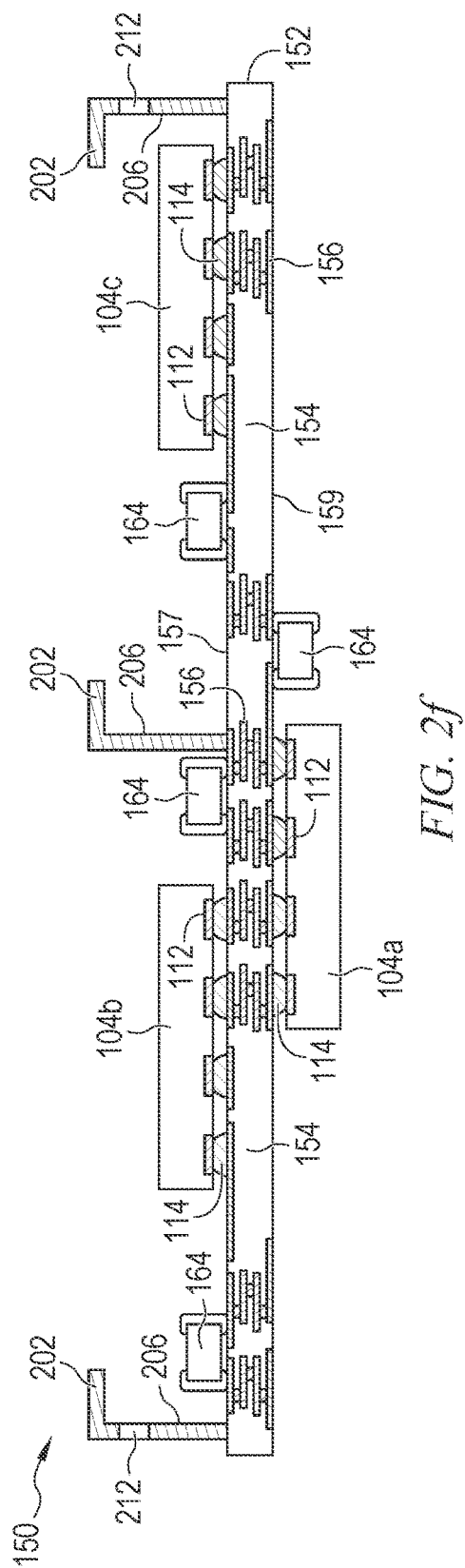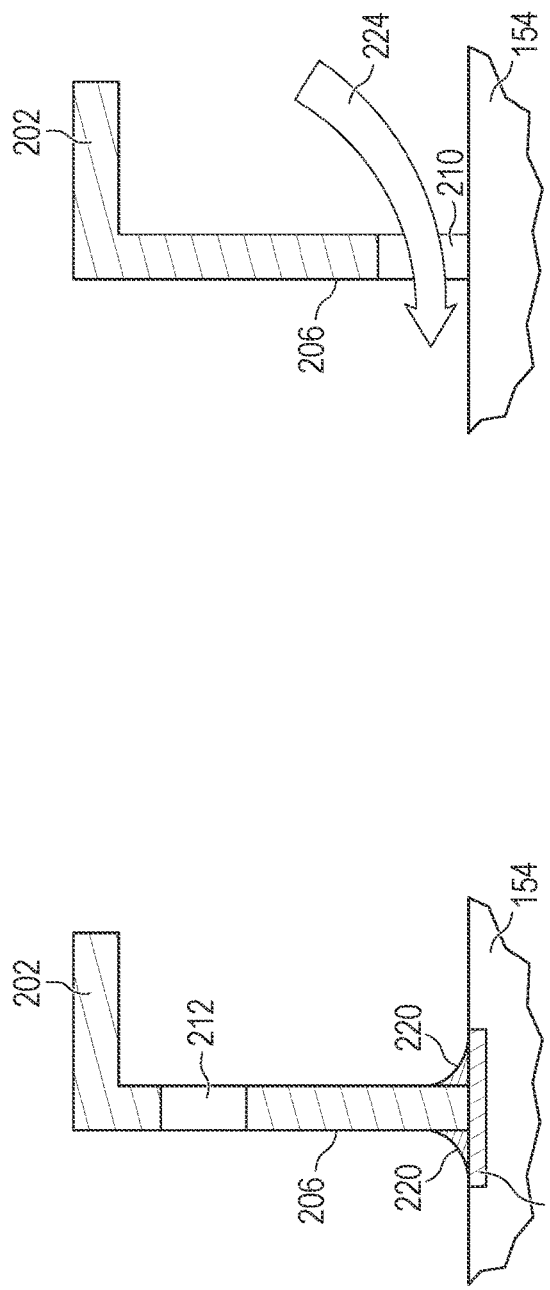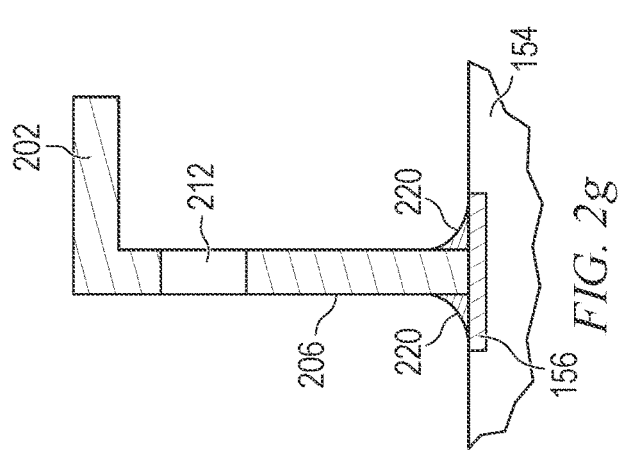

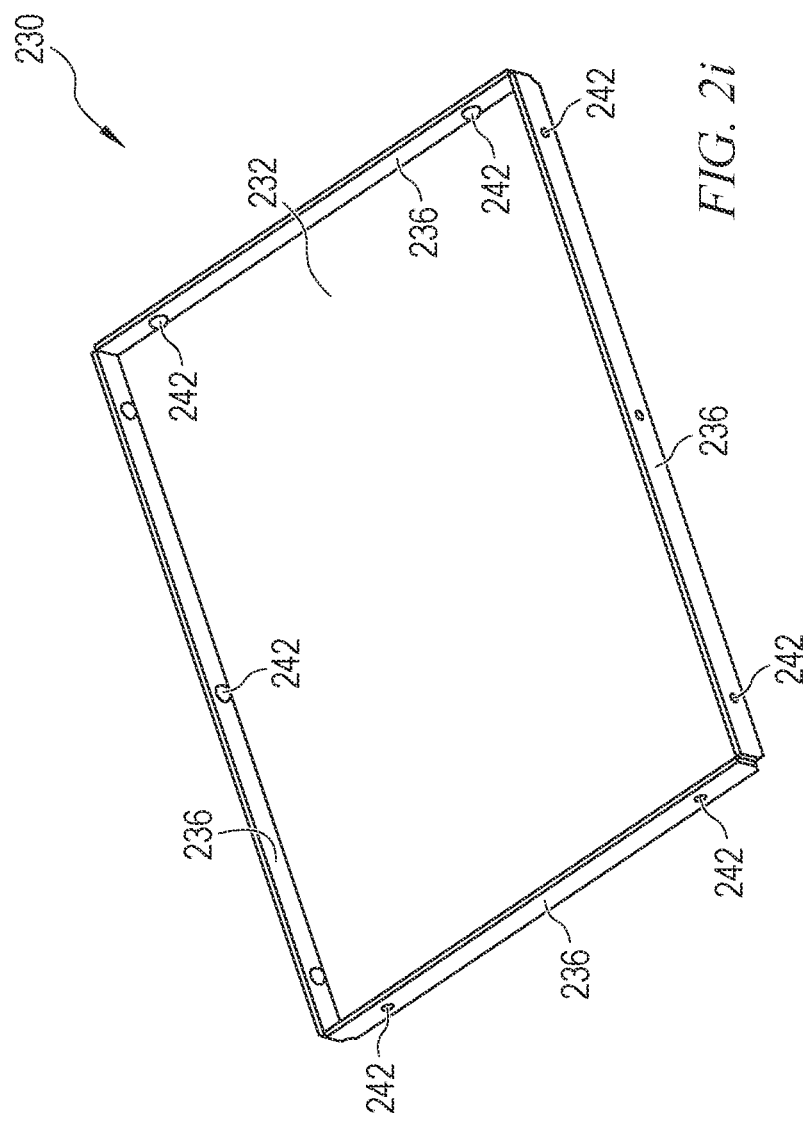

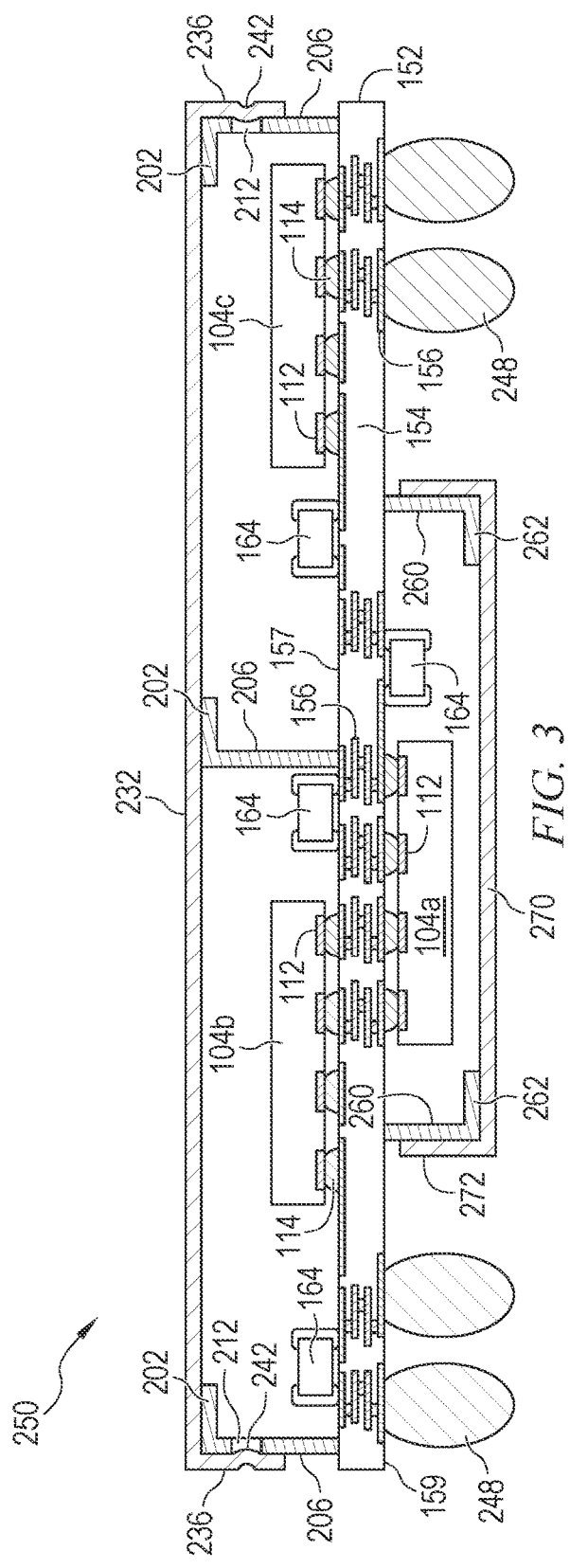
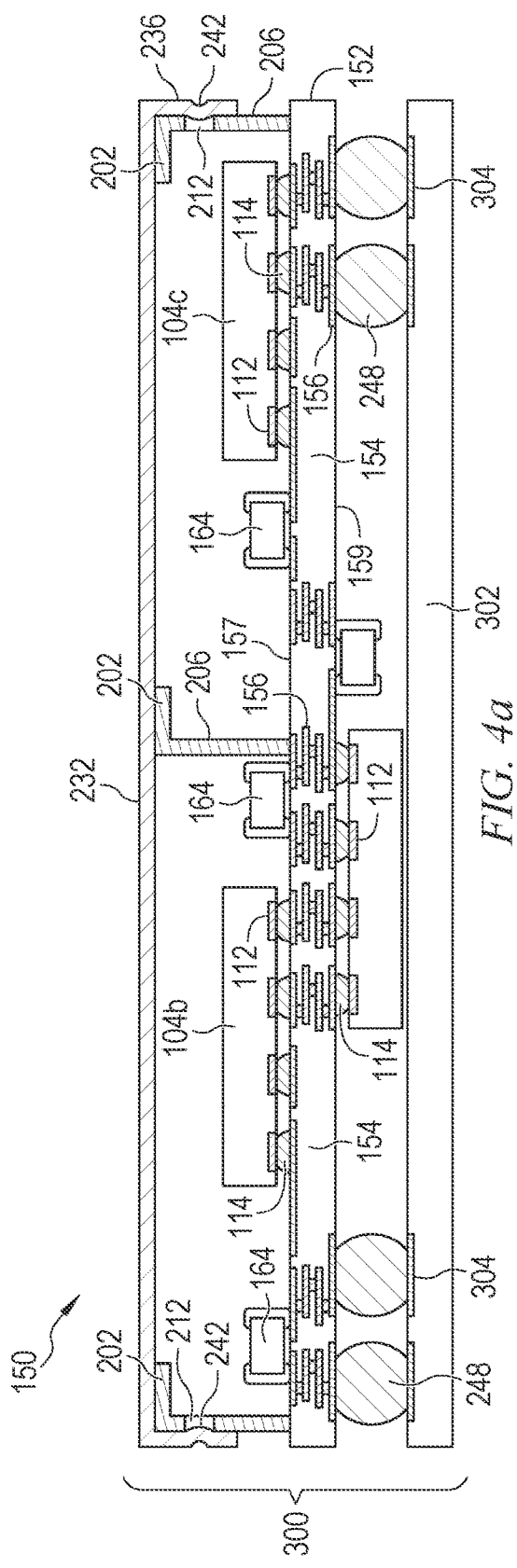
FIG. 3
FIG. 4a

COMPARTMENT SHIELDING WITH METAL FRAME AND CAP

CLAIM TO DOMESTIC PRIORITY

The present application is a continuation of U.S. patent application Ser. No. 17/447,041, now U.S. Pat. No. 11,776,861, filed Sep. 7, 2021, which application is incorporated herein by reference.

FIELD OF THE INVENTION

The present invention relates in general to semiconductor devices and, more particularly, to a semiconductor device and method of forming a shielded semiconductor device using compartment shielding with a metal frame and cap.

BACKGROUND OF THE INVENTION

Semiconductor devices are commonly found in modern electronic products. Semiconductor devices perform a wide range of functions such as signal processing, high-speed calculations, transmitting and receiving electromagnetic signals, controlling electronic devices, transforming sunlight to electricity, and creating visual images for television displays. Semiconductor devices are found in the fields of communications, power conversion, networks, computers, entertainment, and consumer products. Semiconductor devices are also found in military applications, aviation, automotive, industrial controllers, and office equipment.

Semiconductor devices are often susceptible to electromagnetic interference (EMI), radio frequency interference (RFI), harmonic distortion, or other inter-device interference, such as capacitive, inductive, or conductive coupling, also known as cross-talk, which can interfere with their operation. High-speed analog circuits, e.g., radio frequency (RF) filters, or digital circuits also generate interference.

Conductive layers are commonly formed over semiconductor packages to shield electronic parts within the package from EMI and other interference. The shielded components are encapsulated in an insulating molding compound, and then a conductive layer is sputtered onto the molding compound to form a shielding layer around the components. Shielding layers absorb EMI before the signals can hit semiconductor die and discrete components within the package, which might otherwise malfunction. Shielding layers are also formed over packages with components that are expected to generate EMI to protect nearby devices.

One problem with prior art methods of semiconductor package shielding is that forming the shielding layer over encapsulated components is a complicated process involving several costly steps. Shielding components from intra-package interference is especially costly, requiring trenching of the encapsulant and deposition of metal to fill the trench. The encapsulant also limits thermal release of the underlying components, which causes problems for thermal budgets of devices. Moreover, the shielding layers formed on molding compound have durability issues and are susceptible to peeling off. Therefore, a need exists for an improved shielding mechanism for semiconductor packages.

BRIEF DESCRIPTION OF THE DRAWINGS

FIGS. 2a-2k illustrate formation of a shielded semiconductor package using a metal frame and lid;

FIG. 3 illustrates a double-sided embodiment; and

FIGS. 4a and 4b illustrate integrating the shielded packages into an electronic device.

DETAILED DESCRIPTION OF THE DRAWINGS

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings. The term "semiconductor die" as used herein refers to both the singular and plural form of the words, and accordingly, can refer to both a single semiconductor device and multiple semiconductor devices.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, and resistors, create a relationship between voltage and current necessary to perform electrical circuit functions.

Back-end manufacturing refers to cutting or singulating the finished wafer into the individual semiconductor die and packaging the semiconductor die for structural support, electrical interconnect, and environmental isolation. To singulate the semiconductor die, the wafer is scored and broken along non-functional regions of the wafer called saw streets or scribes. The wafer is singulated using a laser cutting tool or saw blade. After singulation, the individual semiconductor die are mounted to a package substrate that includes pins or contact pads for interconnection with other system components. Contact pads formed over the semiconductor die are then connected to contact pads within the package. The electrical connections can be made with conductive layers, bumps, stud bumps, conductive paste, bond wires, or other suitable interconnect structure. An encapsulant or other molding compound is deposited over the package to provide physical support and electrical isolation. The finished package is then inserted into an electrical system and the functionality of the semiconductor device is made available to the other system components.

Figure 1A:
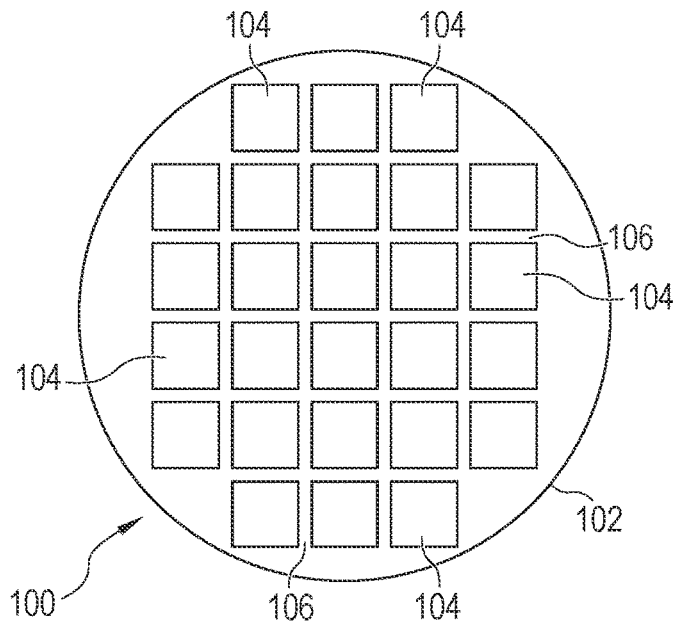
FIGS. 1a-1c illustrate a semiconductor wafer with a plurality of semiconductor die separated by a saw street.

FIG. 1a shows a semiconductor wafer 100 with a base substrate material 102, such as silicon, germanium, aluminum phosphide, aluminum arsenide, gallium arsenide, gallium nitride, indium phosphide, silicon carbide, or other bulk semiconductor material. A plurality of semiconductor die or components 104 is formed on wafer 100 separated by a non-active, inter-die wafer area or saw street 106 as described above. Saw street 106 provides cutting areas to singulate semiconductor wafer 100 into individual semiconductor die 104. In one embodiment, semiconductor wafer 100 has a width or diameter of 100-450 millimeters (mm).

Figure 1B:
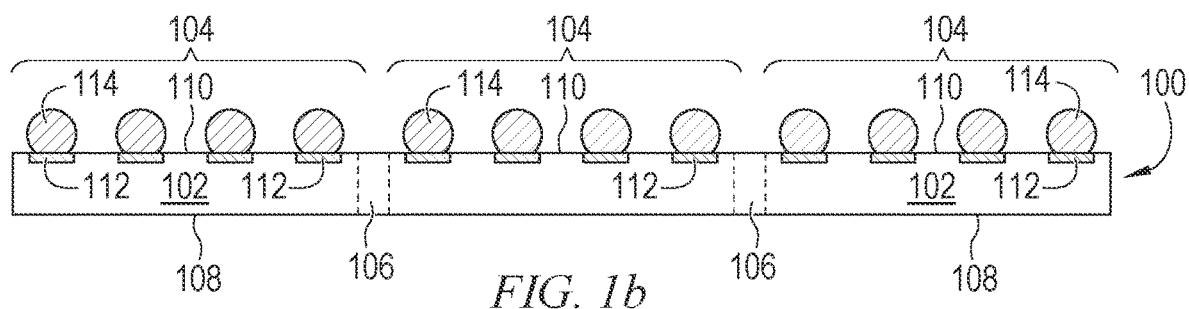

FIG. 1b shows a cross-sectional view of a portion of semiconductor wafer 100. Each semiconductor die 104 has a back or non-active surface 108 and an active surface 110 containing analog or digital circuits implemented as active devices, passive devices, conductive layers, and dielectric layers formed within or over the die and electrically interconnected according to the electrical design and function of the die. For example, the circuit may include one or more transistors, diodes, and other circuit elements formed within active surface 110 to implement analog circuits or digital circuits, such as digital signal processor (DSP), ASIC, MEMS, memory, or other signal processing circuit. Semiconductor die 104 may also contain integrated passive devices (IPDs), such as inductors, capacitors, and resistors, for RF signal processing. Back surface 108 of semiconductor wafer 100 may undergo an optional backgrinding operation with a mechanical grinding or etching process to remove a portion of base material 102 and reduce the thickness of semiconductor wafer 100 and semiconductor die 104.

An electrically conductive layer 112 is formed over active surface 110 using PVD, CVD, electrolytic plating, electroless plating process, or other suitable metal deposition process. Conductive layers 112 include one or more layers of aluminum (Al), copper (Cu), tin (Sn), nickel (Ni), gold (Au), silver (Ag), or other suitable electrically conductive material. Conductive layer 112 operates as contact pads electrically connected to the circuits on active surface 110.

Conductive layer 112 can be formed as contact pads disposed side-by-side a first distance from the edge of semiconductor die 104, as shown in FIG. 1b. Alternatively, conductive layer 112 can be formed as contact pads that are offset in multiple rows such that a first row of contact pads is disposed a first distance from the edge of the die, and a second row of contact pads alternating with the first row disposed a second distance from the edge of the die. Conductive layer 112 represents the last conductive layer formed over semiconductor die 104 with contact pads for subsequent electrical interconnect to a larger system. However, there may be one or more intermediate conductive and insulating layers formed between the actual semiconductor devices on active surface 110 and contact pads 112 for signal routing.

An electrically conductive bump material is deposited over conductive layer 112 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 112 using a suitable attachment or bonding process. In one embodiment, the bump material is reflowed by heating the material above its melting point to form conductive balls or bumps 114. In one embodiment, conductive bumps 114 are formed over an under bump metallization (UBM) having a wetting layer, barrier layer, and adhesion layer. Conductive bumps 114 can also be compression bonded or thermocompression bonded to conductive layer 112. Conductive bumps 114 represent one type of interconnect structure that can be formed over conductive layer 112 for electrical connection to a substrate. The interconnect structure can also use bond wires, conductive paste, stud bump, micro bump, or other electrical interconnect.

Figure 1C:
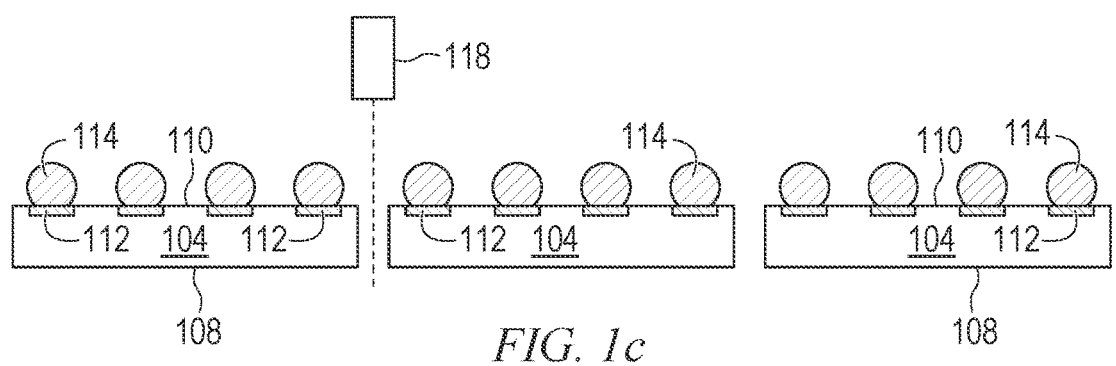

In FIG. 1c, semiconductor wafer 100 is singulated through saw street 106 using a saw blade or laser cutting tool 118 into individual semiconductor die 104. The individual semiconductor die 104 can be inspected and electrically tested for identification of KGD post-singulation.

Figure 2A:
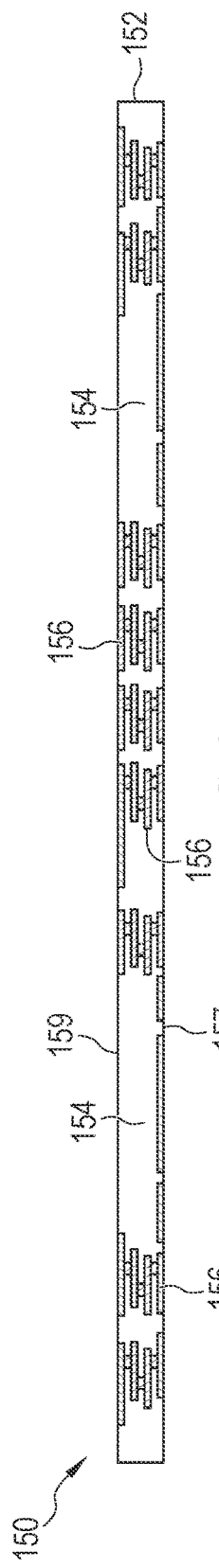

FIGS. 2a-2k illustrate forming shielded semiconductor packages 150 with semiconductor die 104. FIG. 2a is a partial cross-sectional view of a substrate 152 used as a base for manufacturing the packages. Substrate 152 can be a unit substrate singulated from a larger panel or remain as part of a larger substrate panel. Hundreds or thousands of packages are commonly formed in a single panel using the same steps described herein.

Substrate 152 includes one or more insulating layers 154 interleaved with one or more conductive layers 156. Insulating layer 154 is a core insulating board in one embodiment, with conductive layers 156 patterned over the top and bottom surfaces, e.g., a copper-clad laminate substrate. Conductive layers 156 also include conductive vias electrically coupled through insulating layers 154. Substrate 152 can include any number of conductive and insulating layers interleaved over each other. A solder mask or passivation layer can be formed over either side of substrate 152. Any suitable type of substrate or leadframe is used for substrate 152 in other embodiments.

Any components desired to implement the intended functionality of packages 150 are mounted to or disposed over substrate 152 and electrically connected to conductive layers 156. Substrate 152 has two major surfaces: top surface 157 and bottom surface 159. Components can be mounted onto top surface 157 and bottom surface 159 in any suitable configuration.

Figure 2B:
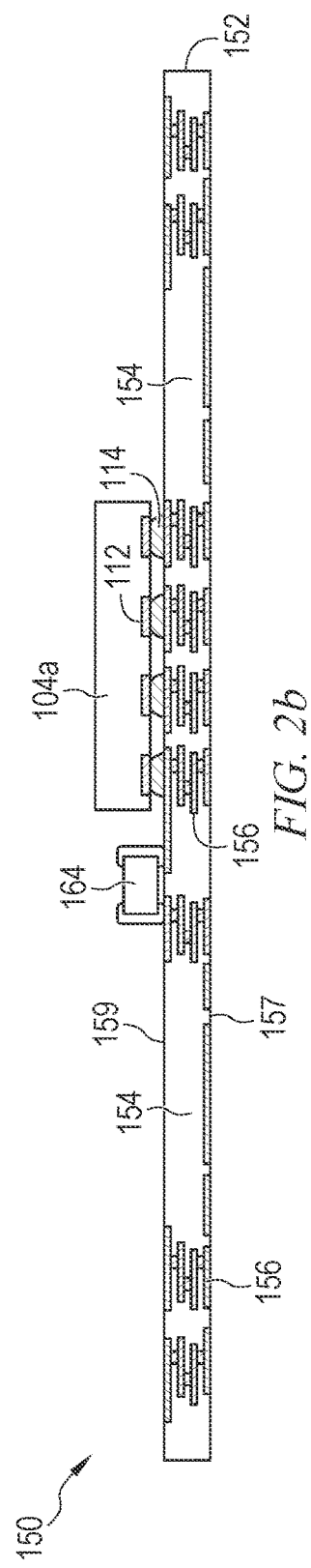

In FIG. 2b, manufacturing of package 150 on substrate 152 commences with surface mounting of semiconductor die 104a and discrete component 164 on bottom surface 159. Bottom components are mounted first, but manufacturing could also proceed with components disposed on top surface 157 first. Discrete components 164, e.g., resistors, capacitors, inductors, transistors, or diodes, are mounted on bottom surface 159 using solder paste or another suitable attachment and connection mechanism. Solder paste is reflowed between terminals of discrete components 164 and contact pads of conductive layers 156 on bottom surface 159.

Figure 2C:
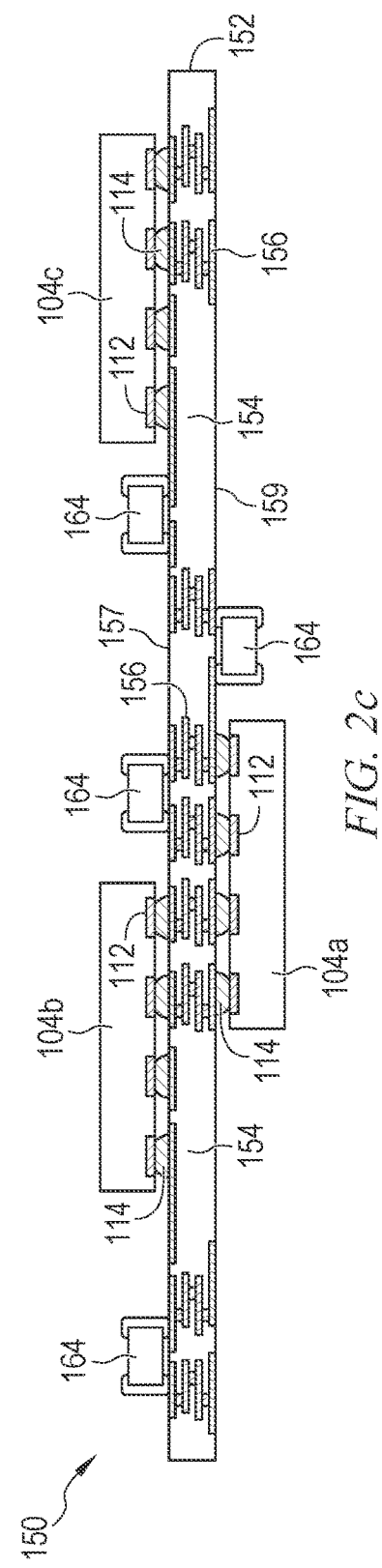

In FIG. 2c, substrate 152 is flipped and semiconductor die 104b, semiconductor die 104c, and additional discrete components 164 are mounted on top surface 157. Semiconductor die 104a-104c can all be identical semiconductor die from the same wafer 100. In other embodiments, semiconductor die 104a is a digital processor chip and semiconductor die 104b and 104c are flash memory or RAM chips that are connected to semiconductor die 104a for use by the processor. Any suitable combination of active, passive, and integrated components can be mounted on top surface 157 and bottom surface 159 in any suitable configuration.

Figure 2D:
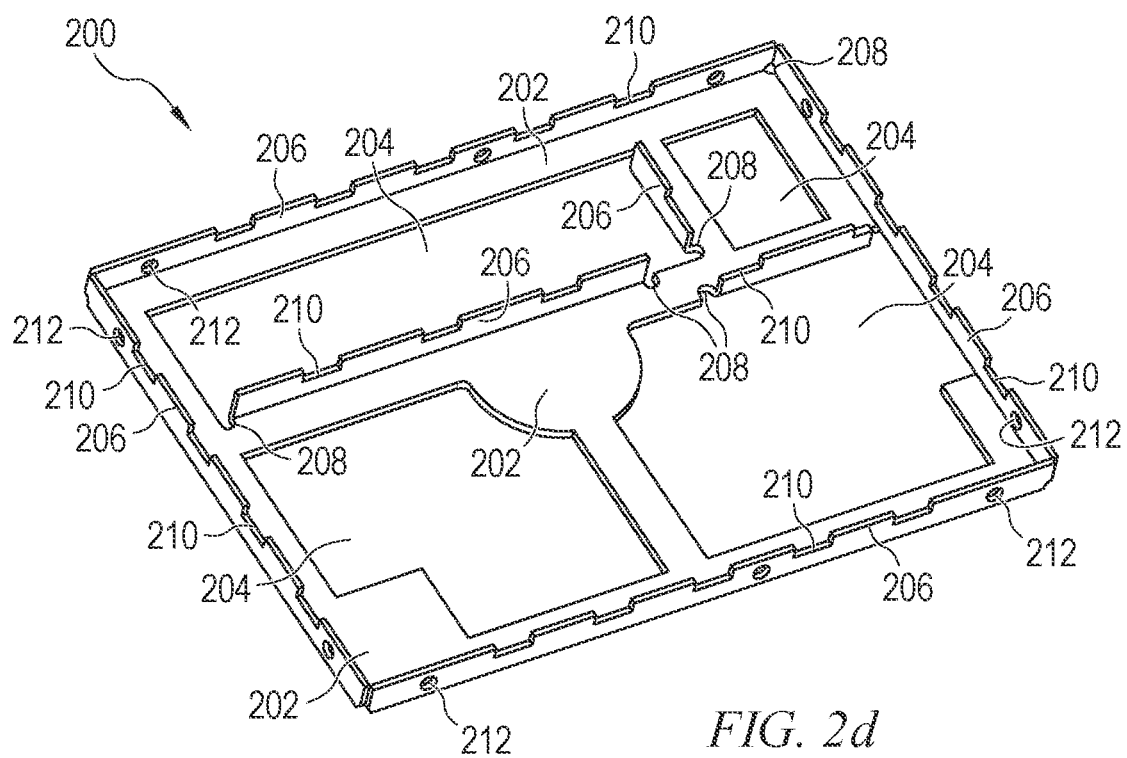
Figure 2E:
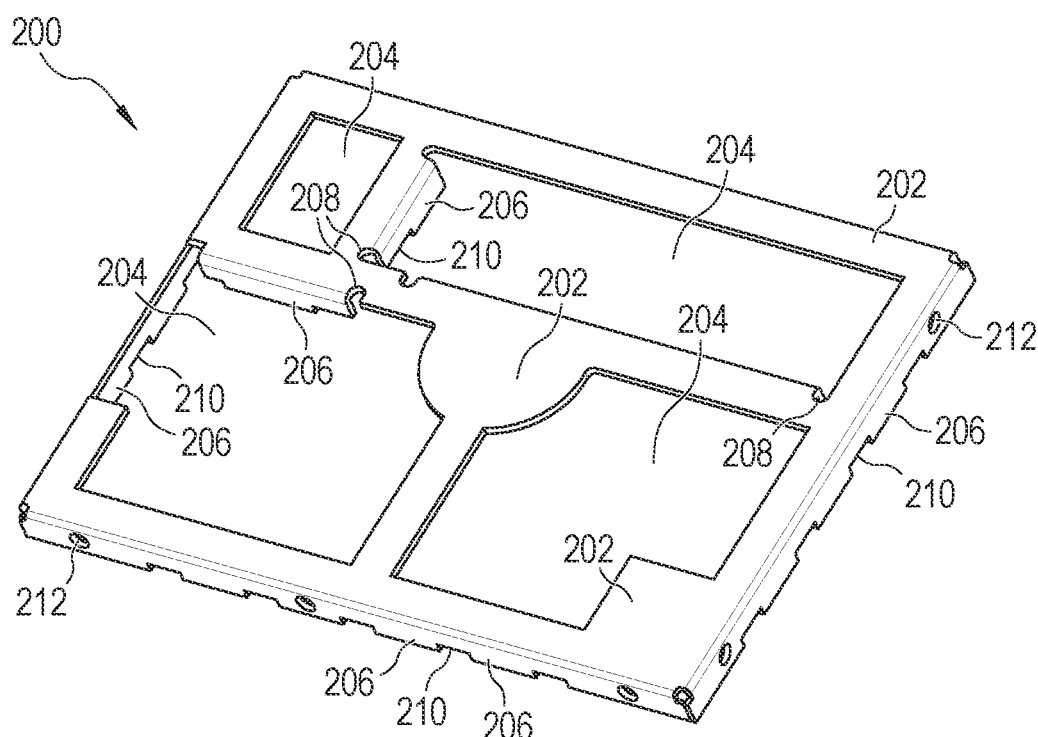

FIGS. 2d and 2e show a metal frame 200 that will be mounted to top surface 157 of substrate 152 to facilitate shielding. FIG. 2d is a view from below frame 200, while FIG. 2e is a view from above. Frame 200 is formed from a piece of sheet metal in one embodiment. The metal can be aluminum, steel, copper, titanium, gold, silver, alloys thereof, or any other suitable metal material. Non-metallic materials can be used in other embodiments. The sheet metal is cut to the proper shape and then folded into the structure seen in FIGS. 2d and 2e. The remaining flat sheet metal pieces after cutting and folding operate as a roof 202 for the frame.

Cutting is used to form a plurality of openings 204 and flaps 206 in frame 200 prior to folding. Divots 208 are optionally formed into the sheet metal at the edges of flaps 206 to improve reliability of folding the flaps while the remainder of sheet metal remains flat. Divots 208 are semicircular shaped in the illustrated embodiment but could also be any suitable polygon. Notches 210 are formed at the edge of each flap 206. Notches 210 result in flaps 206 having castellated edges. Flaps 206 are castellated. Notches 210 that are formed around the perimeter of frame 200 have holes 212 formed therethrough, which will be used to hold a lid onto frame 200.

The cutting of sheet metal into frame 200 can be performed using a laser cutter, die punch, or other suitable method. Flaps 206 are all folded at a 90-degree angle toward the bottom of frame 200 after cutting using any suitable manufacturing process. Alternatively, frame 200 can be molded, machined, or otherwise formed into the desired shape.

FIG. 2f shows a cross-section of frame 200 disposed or mounted onto or over top surface 157 of substrate 152 using, e.g., a pick and place operation. Flaps 206 are oriented downward around and between the mounted components so that the ends of the flaps contact substrate 152. Roof 202 is oriented away from substrate 152. Roof 202 reinforces the strength of frame 200 and makes handling during manufacture without damaging the frame more reliable.

Flaps 206 are formed around the full perimeter of frame 200 to surround all components to be shielded. In addition, flaps 206 are optionally formed within frame 200 to separate the shielded area into multiple separately shielded compartments. Flaps 206 internal to frame 200, i.e., not on the perimeter, provide shielding between components on top surface 157, e.g., between die 104b and die 104c, so that the different components do not cause interference in each other.

The areas of flaps 206 without notches 210 can be attached to conductive layer 156 of substrate 152 using solder 220 as shown in the partial cross-section of FIG. 2g. The soldering can be performed using any suitable surface mount or other soldering technique. In one embodiment, solder 220 is disposed on contact pads of conductive layer 156 as solder paste prior to disposing frame 200 onto the substrate and then reflowed to physically and electrically couple the frame to substrate 152. Flaps 206 can be soldered continuously everywhere that the flaps meet substrate 200 or only a few select points can be soldered, e.g., just one point of solder 220 for each of the four corners.

FIG. 2h shows another partial cross-section through a notch 210. Notches 210 provide gaps between frame 200 and substrate 152 so that de-ionized water used during flux cleaning flows out of the frame as indicated by arrow 224 rather than being trapped between substrate 152, flaps 206, and roof 202. Any fluid used to clean or otherwise process packages 150 is able to escape frame 200 via notches 210. Conductive layer 156 may extend under notches 210 or may include breaks as illustrated.

FIG. 2i shows a lid 230 that will be installed on frame 200 to complete the shielding functionality. Lid 230 is formed from sheet metal similarly to frame 200. No holes are formed through top 232 as was done with holes 204 of frame 200 so that the sheet metal of the lid will create a complete cover over the components on substrate 152. Alternatively, openings could be formed resulting in select underlying components not being shielded by lid 230.

Flaps 236 are formed around the perimeter of lid 230 by cutting the sheet metal into the desired shape as with frame 200. Flaps 236 are folded at a 90-degree angle to form sidewalls for lid 230. Indentations 242 are formed in the flaps 236 at locations that correspond in position to openings 212 of frame 200. Flaps 236 are folded so that indentations 242 extend inward toward the interior of the lid.

Figure 2J:
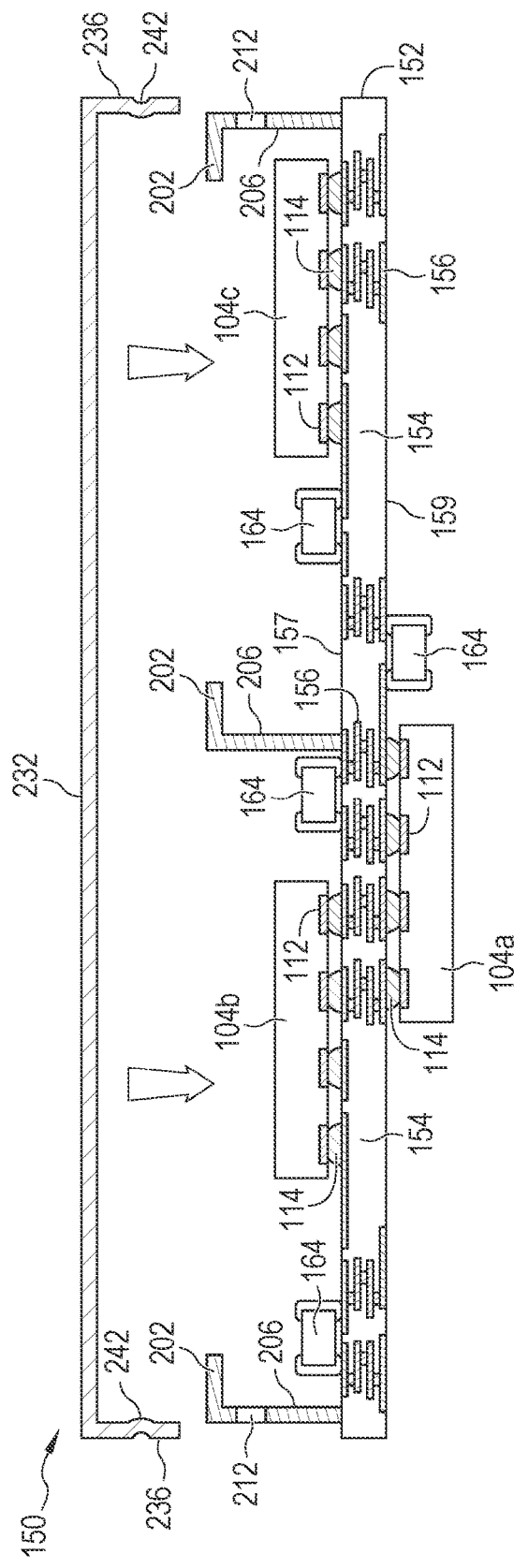
Figure 2K:
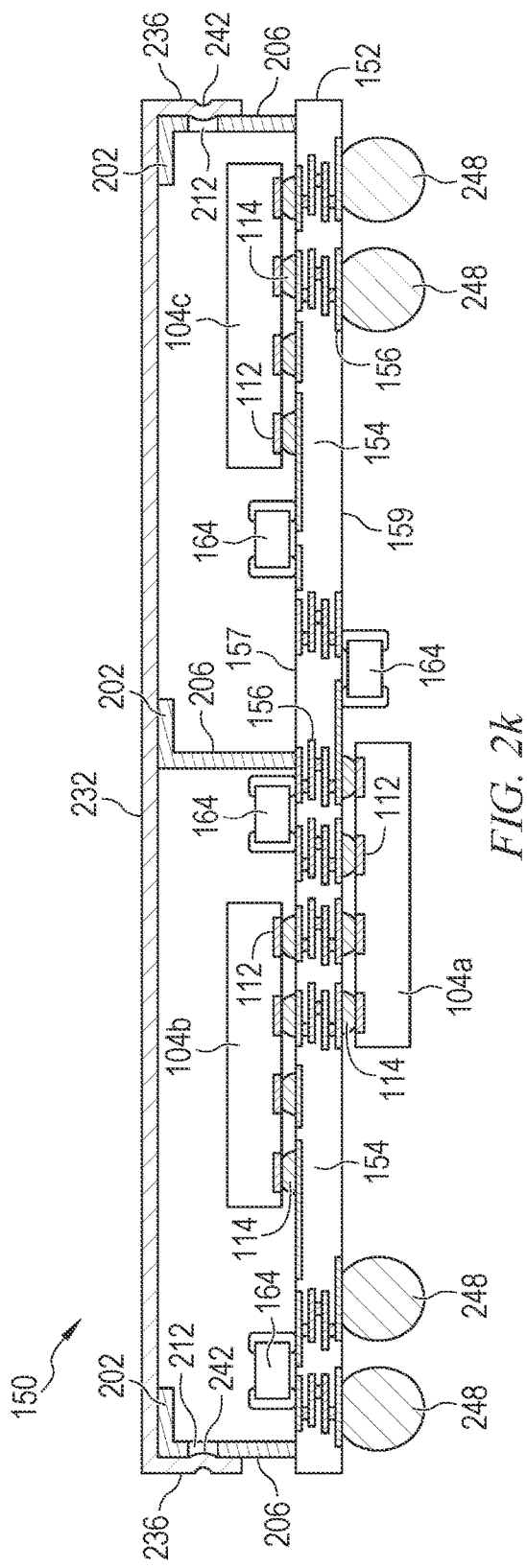

An inner width between flaps 236 of lid 230 is approximately equal to or slightly larger than an outer width between the perimeter flaps 206 of frame 200. When lid 230 is disposed on frame 200 as shown in FIG. 2j, flaps 236 slide around flaps 206. Indentations 242 press against the outsides of flaps 206, expanding flaps 236 of lid 230. Once lid 230 is fully pressed down as shown in FIG. 2k, flaps 236 spring inward with indentations 242 of the lid pressing partially into openings 212 of frame 200. Lid 230 is secured by the elastic characteristic of the lid keeping indentations 242 pressed into openings 212. While an indentation 242 is shown which is pressed into the outside of lid 230 creating a bump toward the inside, a protrusion could also be created oriented inward while leaving the outer surfaces of flaps 236 flat. Moreover, openings 212 could simply be an indentation instead of a hole formed completely through flaps 206. Openings 212 and indentations 242 operate as a latch to secure lid 230.

Bumps 248 are added in FIG. 2k for mounting package 140 onto a larger substrate of a device being manufactured. Bumps 248 are formed similarly to bumps 114 of die 104. Substrate 152 is singulated if necessary. Package 150 in FIG. 2k is a completed semiconductor package. The combination metal shield frame 200 and can lid 230 creates a complete compartmentalized EMI shield for package 150. The combination of frame 200 and lid 230 extends over and around all components on top surface 157 of substrate 152 to provide thorough shielding. Flaps 206 also extend down between different components to compartmentalize the shielding and thereby reduce intra-package interference.

Utilizing frame 200 and lid 230 eliminates the encapsulant that is commonly used for shielded components and reduces complexity of creating compartment shielding within the encapsulant. Frame 200 and lid 230 are also more reliable than the prior art methods due to the lid not being susceptible to peeling from encapsulant.

FIG. 3 shows another embodiment where a second shield is formed over the components on bottom surface 159. The bottom shield includes a frame with flaps 260 and roof 262 just as with frame 200 on top surface 157. Additional flaps 260 are formed within the middle of the frame if desired to create compartmentalized shielding. Flaps 260 include all the same features from flaps 206, e.g., castellated edges and openings to interface with bumps or indentations on lid 270. Lid 270 including flaps 272 is disposed over the bottom frame to complete the bottom shield. Flaps 272 include bumps or indentations that extend into an opening or dent in flaps 260. Bottom shield 260-272 can be disposed on bottom surface 159 immediately after the other bottom components are mounted in FIG. 2b, or at any other manufacturing stage.

Figure 4B:
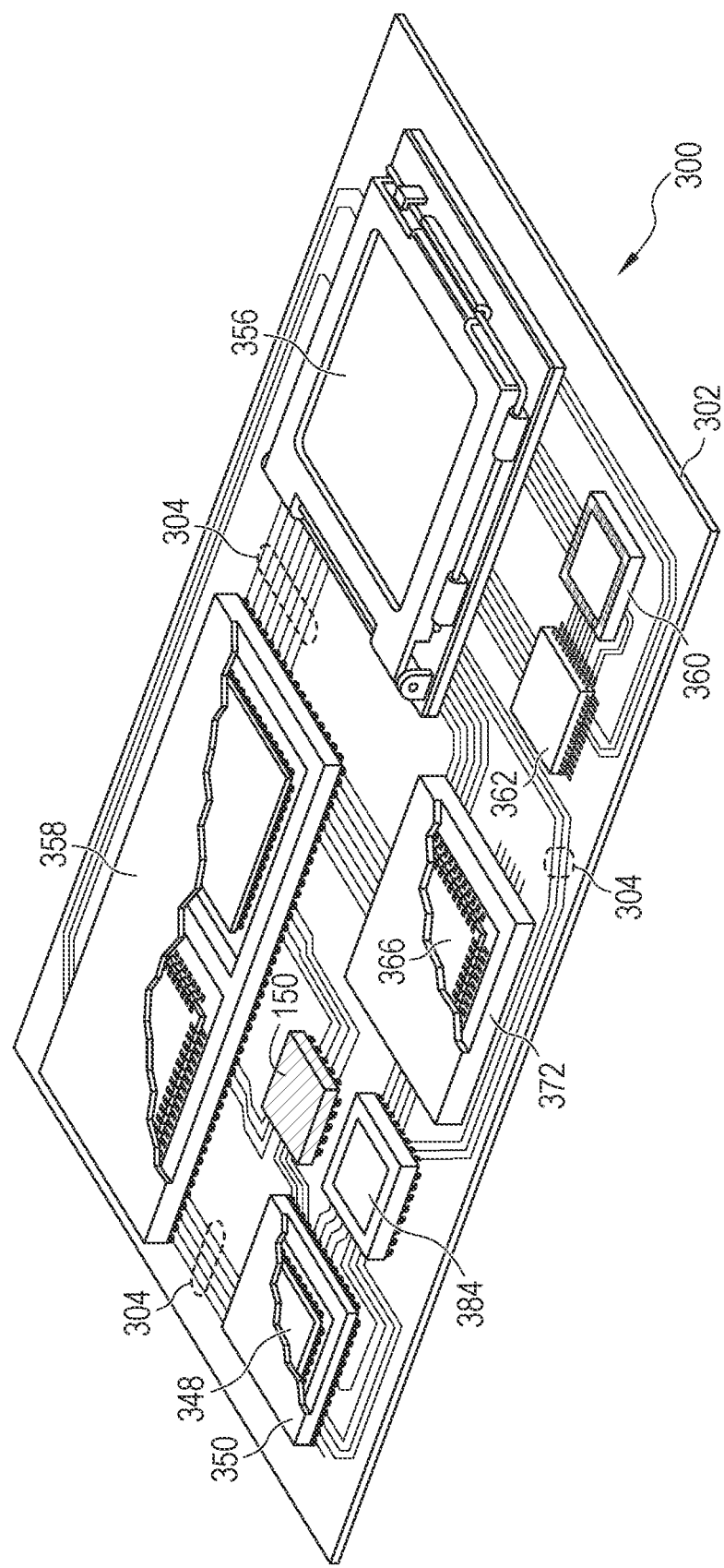

FIGS. 4a and 4b illustrate incorporating the above-described semiconductor packages, e.g., package 150, into an electronic device 300. FIG. 4a illustrates a partial cross-section of package 150 mounted onto a printed circuit board (PCB) or other substrate 302 as part of electronic device 300. Bumps 248 are reflowed onto conductive layer 304 of PCB 302 to physically attach and electrically connect package 150 to the PCB. In other embodiments, thermocompression or other suitable attachment and connection methods are used. In some embodiments, an adhesive or underfill layer is used between package 150 and PCB 302. Semiconductor die 104 are electrically coupled to conductive layer 304 through substrate 152 and bumps 248.

FIG. 4b illustrates electronic device 300 including PCB 302 with a plurality of semiconductor packages mounted on a surface of the PCB, including package 150. Electronic device 300 can have one type of semiconductor package, or multiple types of semiconductor packages, depending on the application. Electronic device 300 can be a stand-alone system that uses the semiconductor packages to perform one or more electrical functions. Alternatively, electronic device 300 can be a subcomponent of a larger system. For example, electronic device 300 can be part of a tablet computer, cellular phone, digital camera, communication system, or other electronic device. Electronic device 300 can also be a graphics card, network interface card, or another signal processing card that is inserted into a computer. The semiconductor packages can include microprocessors, memories, ASICs, logic circuits, analog circuits, RF circuits, discrete active or passive devices, or other semiconductor die or electrical components.

In FIG. 4b, PCB 302 provides a general substrate for structural support and electrical interconnection of the semiconductor packages mounted on the PCB. Conductive signal traces 304 are formed over a surface or within layers of PCB 302 using evaporation, electrolytic plating, electroless plating, screen printing, or other suitable metal deposition process. Signal traces 304 provide for electrical communication between the semiconductor packages, mounted components, and other external systems or components. Traces 304 also provide power and ground connections to the semiconductor packages as needed.

In some embodiments, a semiconductor device has two packaging levels. First level packaging is a technique for mechanically and electrically attaching the semiconductor die to an intermediate substrate. Second level packaging involves mechanically and electrically attaching the intermediate substrate to PCB 302. In other embodiments, a semiconductor device may only have the first level packaging where the die is mechanically and electrically mounted directly to PCB 302.

For the purpose of illustration, several types of first level packaging, including bond wire package 346 and flipchip 348, are shown on PCB 302. Additionally, several types of second level packaging, including ball grid array (BGA) 350, bump chip carrier (BCC) 352, land grid array (LGA) 356, multi-chip module (MCM) 358, quad flat non-leaded package (QFN) 360, quad flat package 362, and embedded wafer level ball grid array (eWLB) 364 are shown mounted on PCB 302 along with package 150. Conductive traces 304 electrically couple the various packages and components disposed on PCB 302 to package 150, giving use of the components within package 150 to other components on the PCB.

Depending upon the system requirements, any combination of semiconductor packages, configured with any combination of first and second level packaging styles, as well as other electronic components, can be connected to PCB 302. In some embodiments, electronic device 300 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using less expensive components and a streamlined manufacturing process. The resulting devices are less likely to fail and less expensive to manufacture resulting in a lower cost for consumers.

While one or more embodiments of the present invention have been illustrated in detail, the skilled artisan will appreciate that modifications and adaptations to those embodiments may be made without departing from the scope of the present invention as set forth in the following claims.

What is claimed:

1. A method of making a semiconductor device, comprising:

providing a substrate including a conductive layer formed on an external surface of the substrate;

disposing a first semiconductor die on the external surface of the substrate, wherein the first semiconductor die is a bare die as singulated from a semiconductor wafer with base semiconductor material exposed at a back surface and a plurality of side surfaces of the first semiconductor die without encapsulant deposited over the first semiconductor die;

forming a first metal frame by,
  forming a first opening through a sheet of metal including a first flap of the sheet extending into the first opening, wherein the first flap includes a castellated edge, and wherein the first opening includes a first divot directly adjacent to a first side of the first flap and a second divot directly adjacent to a second side of the first flap,
  forming a second opening through the sheet of metal including a second flap of the sheet extending into the second opening along a first edge of the second opening and a third flap of the sheet extending into the second opening along a second edge of the second opening perpendicular to the first edge, wherein a linear portion of the sheet metal between the first opening and second opening extends for an entire length or width of the first metal frame, wherein the first flap and second flap both extend in parallel with the linear portion, wherein the first flap includes a first long side physically contacting the linear portion for an entire length of the first flap and the second flap includes a second long side physically contacting the linear portion for an entire length of the second flap, and wherein the second flap and third flap include castellated edges,
  folding the first flap along the first long side relative to the linear portion, wherein the first flap remains connected to the linear portion along the entire first long side, and wherein the first divot and second divot remain extending into the linear portion after folding the first flap,
  folding the second flap along the second long side relative to the linear portion, wherein the second flap remains connected to the linear portion along the entire second long side, wherein the linear portion remains as a portion of a roof for the first metal frame after folding the first flap and second flap,
  folding the third flap, and
  folding an outer edge of the first metal frame as a fourth flap, wherein the fourth flap includes a castellated edge including a plurality of notches formed in the castellated edge;

disposing the first metal frame over the substrate around the first semiconductor die, wherein the fourth flap is physically and electrically coupled to the substrate by a solder reflowed between the fourth flap and conductive layer, and wherein the conductive layer includes breaks under the notches of the castellated edge such that the conductive layer does not extend under the notches; and disposing a first metal lid over the first metal frame, wherein a flap of the first metal lid includes an elastic characteristic to latch onto the first metal frame.

2. The method of claim 1, further including:
forming the first flap by,
  cutting across a first end of the first flap;
  cutting across a second end of the first flap opposite the second end, and cutting a second long side of the first flap from the first end to the second end, wherein the first long side of the first flap remains contacting the linear portion for an entire length of the first flap; and forming the second flap by,
cutting across a first end of the second flap;
cutting across a second end of the second flap opposite the second end, and
cutting a second long side of the second flap from the first end to the second end, wherein the first long side of the second flap remains contacting the linear portion for an entire length of the second flap.

3. The method of claim 1, further including:
forming a recess in the first metal frame; and
forming a protrusion on the first metal lid, wherein the protrusion aligns to the recess when the first metal lid is latched onto the first metal frame.

4. The method of claim 1, further including forming a plurality of fourth flaps as part of the first metal frame, wherein each of the plurality of fourth flaps is folded to create sidewalls extending around a perimeter of the first metal frame.

5. The method of claim 1, wherein the first edge of the second opening is oriented toward a center of the first metal frame.

6. The method of claim 1, further including:
disposing a second metal frame over an opposite surface of the substrate from the first metal frame; and
disposing a second metal lid over the second metal frame, wherein a flap of the second metal lid includes an elastic characteristic to latch onto the second metal frame.

7. The method of claim 6, further including disposing a solder bump over the opposite surface of the substrate, wherein the solder bump extends from the opposite surface of the substrate to a height over the opposite surface of the substrate that is greater than a height of the second frame and second lid over the opposite surface of the substrate.

8. A method of making a semiconductor device, comprising:
providing a substrate;
disposing a first semiconductor die and second semiconductor die over a first surface of the substrate;
disposing a first discrete component on the first surface of the substrate adjacent to the first semiconductor die;
disposing a second discrete component on the first surface of the substrate adjacent to the second semiconductor die;
disposing a first frame over the first surface of the substrate around the semiconductor die, wherein the first frame includes an opening and a flap formed at an edge of the opening, and wherein the flap includes a castellated edge, and wherein the flap is disposed with the first discrete component and first semiconductor die on a first side of the flap and the second discrete component and second semiconductor die on a second side of the flap;
disposing a first lid over the first frame, wherein a sidewall of the first lid includes an elastic characteristic to latch onto the first frame;
disposing a third semiconductor die over a second surface of the substrate opposite the first surface, wherein the first semiconductor die, second semiconductor die, and third semiconductor die are identical semiconductor die singulated from a common semiconductor wafer;
disposing a third discrete component on the second surface of the substrate adjacent to the third semiconductor die;
disposing a second frame over the second surface of the substrate, wherein the second frame includes an internal flap to compartmentalize shielding provided by the second frame;
disposing a second lid over the second frame, wherein a sidewall of the second lid includes an elastic characteristic to latch onto the second frame; and
disposing a solder bump over the second surface of the substrate, wherein the solder bump is a continuous body of solder that extends from the substrate to a height over the second surface of the substrate that is greater than a height of the second frame and second lid over the second surface of the substrate.

9. The method of claim 8, further including forming a notch in a sidewall of the first frame.

10. The method of claim 8, wherein a portion of the first frame remains between the opening and the sidewall as a roof.

11. The method of claim 8, further including:
forming an indentation in the first lid; and
pressing the first lid onto the first frame until the indentation aligns to a second opening of the first frame.

12. The method of claim 8, wherein the frame includes a plurality of compartments.

13. The method of claim 8, further including attaching the first frame to the substrate using solder.

14. A semiconductor device, comprising:
a substrate;
a first semiconductor die disposed over the substrate, wherein the first semiconductor die is a bare die as singulated from a semiconductor wafer with base semiconductor material exposed at a back surface and a plurality of side surfaces of the first semiconductor die without encapsulant deposited over the first semiconductor die;
a metal frame disposed over the substrate around the first semiconductor die, wherein the metal frame includes,
a first opening,
a first flap formed at an edge of the first opening, wherein the first opening includes a first divot directly adjacent to a first side of the first flap and a second divot directly adjacent to a second side of the first flap, and wherein the first flap includes a castellated edge,
a second opening,
a second flap formed at an edge of the second opening, wherein the second flap includes a castellated edge, and
a linear portion that extends for an entire length or width of the first metal frame between the first opening and second opening, wherein the first flap and second flap both extend in parallel with the linear portion and include respective long sides physically contacting the linear portion for an entire length of the respective first flap or second flap, and wherein the first divot and second divot extend into the linear portion; and
a metal lid disposed over the metal frame, wherein a sidewall of the metal lid includes an elastic characteristic to latch onto the metal frame.

15. The semiconductor device of claim 14, further including a second semiconductor die disposed over the substrate, wherein the first flap or second flap is disposed between the first semiconductor die and second semiconductor die.

16. The semiconductor device of claim 14, further including:
a recess formed in the metal frame; and
a protrusion formed on the metal lid, wherein the protrusion extends into the recess.

17. The semiconductor device of claim 14, wherein the metal frame includes a plurality of third flaps, and wherein each of the plurality of third flaps is folded to create sidewalls extending around a perimeter of the metal frame.

18. The semiconductor device of claim 14, wherein the edge of the first opening is oriented toward a center of the frame.

19. A semiconductor device, comprising:
a substrate;
a first semiconductor die disposed over a first surface of the substrate;
a second semiconductor die disposed over the first surface of the substrate;
a first discrete component disposed on the first surface of the substrate adjacent to the first semiconductor die;
a second discrete component disposed on the first surface of the substrate adjacent to the second semiconductor die;
a first frame disposed over the first surface of the substrate around the semiconductor die, wherein the first frame includes a flap folded down with the first discrete component and first semiconductor die on a first side of the flap and the second discrete component and second semiconductor die on a second side of the flap, and wherein the flap includes a castellated edge;
a first lid disposed over the first frame, wherein a sidewall of the first lid includes an elastic characteristic to latch onto the first frame;
a third semiconductor die disposed over a second surface of the substrate opposite the first surface;
a third discrete component disposed on the second surface of the substrate adjacent to the third semiconductor die;
a second frame disposed over the second surface of the substrate around the third semiconductor die and third discrete component, wherein the second frame includes an internal flap to compartmentalize shielding provided by the second frame;
a second lid disposed over the second frame, wherein a sidewall of the second lid includes an elastic characteristic to latch onto the second frame; and
a solder bump directly attached to the second surface of the substrate, wherein a height of the solder bump over the second surface is greater than a height of the second frame and second lid.

20. The semiconductor device of claim 19, further including a notch in a sidewall of the first frame.

21. The semiconductor device of claim 20, further including an opening formed through the first frame, wherein a portion of the first frame remains between the opening and the sidewall of the first frame as a roof.

22. The semiconductor device of claim 19, further including:
an opening formed in the first frame; and
an indentation formed in the first lid, wherein the indentation extends into the opening.

23. The semiconductor device of claim 19, wherein the first frame includes a plurality of compartments.

24. The semiconductor device of claim 19, further including a solder material connecting the first frame to the substrate.

* * * * *